(12) United States Patent
Nakahara

(10) Patent No.: US 7,701,264 B2
(45) Date of Patent: Apr. 20, 2010

(54) SEMICONDUCTOR OUTPUT CIRCUIT

(75) Inventor: Akihiro Nakahara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/314,421

(22) Filed: Dec. 10, 2008

(65) Prior Publication Data
US 2009/0160499 A1    Jun. 25, 2009

(30) Foreign Application Priority Data
Dec. 21, 2007  (JP) .............................. 2007-329473
Nov. 18, 2008  (JP) .............................. 2008-294519

(51) Int. Cl.
*H03B 1/00*    (2006.01)
(52) U.S. Cl. ...................................... 327/108
(58) Field of Classification Search ................ 327/108, 327/109, 110, 111
See application file for complete search history.

(56) References Cited

U.S. PATENT DOCUMENTS
5,352,932 A    10/1994  Tihanyi
5,910,738 A *  6/1999  Shinohe et al. ............. 327/108
5,914,619 A    6/1999  Tihanyi
2006/0006922 A1  1/2006  Sander

FOREIGN PATENT DOCUMENTS
JP    6-188710    7/1994

OTHER PUBLICATIONS

E. M. Blaser et al., "Substrate Compensation for Depletion Mode FET Circuits," ip.com Journal, ip.com Inc., West Henrietta, NY, Dec. 1, 1976, XP013076017 ISSN: 1533-0001.

* cited by examiner

*Primary Examiner*—Jeffrey S Zweizig
(74) *Attorney, Agent, or Firm*—Foley & Lardner LLP

(57) ABSTRACT

To improve a depletion transistor provided between a control terminal of an output transistor and an output terminal coupled to a load not to enter a conductive state when the output transistor is in the conductive state. The output transistor is served as a source follower. Control voltages which controlling the conductive state/nonconductive state of the depletion transistor are supplied to both a control terminal (gate) and a substrate terminal (back gate) of the depletion transistor.

5 Claims, 3 Drawing Sheets

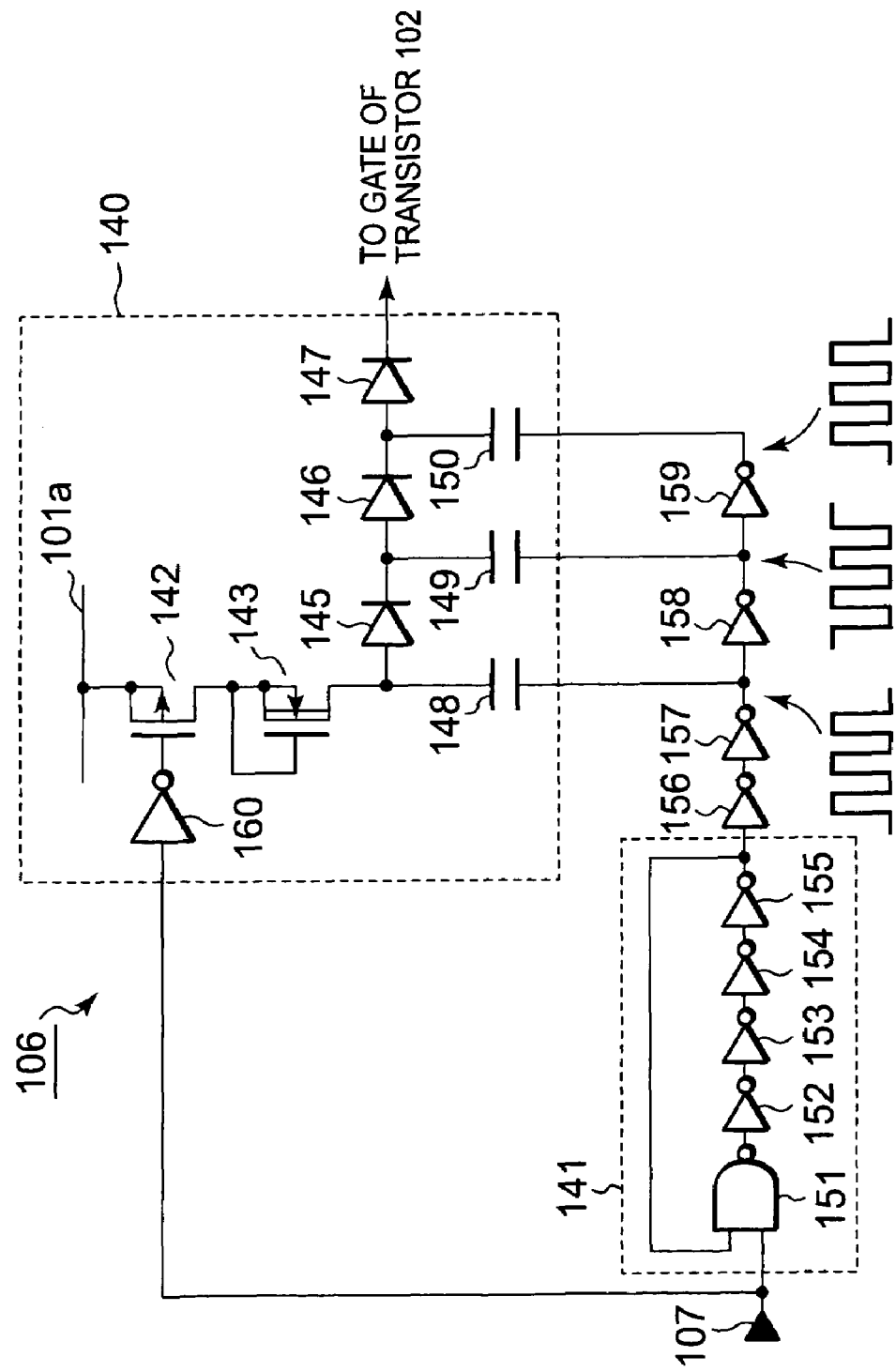

SEMICONDUCTOR OUTPUT CIRCUIT

BACKGROUND

1. Field of the Invention

The present invention relates to a semiconductor output circuit, and more particularly, to a semiconductor output circuit which controls power supply to a load.

2. Description of the Related Art

As a semiconductor output circuit using a source follower output transistor for supplying power to a load, for example, there is a circuit disclosed in Japanese Unexamined Patent Application Publication No. Hei 06-188710, which is equivalent to U.S. Pat. No. 5,352,932 (hereinafter, referred to as Tihanyi). The above-mentioned semiconductor output circuit is basically structured by coupling as a source follower an output transistor between a power supply line and an output terminal being coupled with a load, and controlling a conductive state/nonconductive state of the output transistor to control power supply to the load.

In particular, the output transistor is shifted from the conductive state to the nonconductive state by coupling a depletion transistor between the gate and the source of the output transistor.

However, the inventor has noticed the following problem inherent in the output transistor. In the output circuit disclosed in Tihanyi, the source and the substrate terminal (back gate) of the depletion transistor are commonly coupled. In the case where the output transistor is in the conductive state, the depletion transistor is required to be in the nonconductive state, but in some cases, is in the conductive state.

In other words, when the output transistor is in the conductive state, the gate of the depletion transistor is supplied with a ground potential, whereas a source potential of the output transistor, which is nearly equal to a power supply potential, appears on the source thereof. As a result, the voltage applied between the gate and the source of the depletion transistor is in the state exceeding a so-called cut-off voltage, and accordingly, the depletion transistor enters the nonconductive state.

In the output circuit disclosed in Tihanyi, because the conductive state/nonconductive state of the depletion transistor is controlled using the power supply voltage (for example, battery voltage), a device having a higher breakdown voltage is required. A drain current (leak current) with respect to the voltage applied between the gate and the source is compared between a depletion transistor having a higher breakdown voltage and a depletion transistor having a lower breakdown voltage. As a result, it is revealed that in the depletion transistor having a higher breakdown voltage, compared with the depletion transistor having a lower breakdown voltage, the drain current (leak current) hovers at high level in the state of having a value larger by one digit or more (does not drop) and is not completely cut off (does not enter the nonconductive state) even when the voltage applied between the gate and the source is reduced.

SUMMARY

A semiconductor output circuit according to one feature of the present invention includes: an output transistor coupled between a power supply line and an output terminal, the output terminal being configured to be coupled with a load; a depletion transistor coupled between a control terminal of the output transistor and the output terminal; and a control circuit supplying control voltages to both a control terminal and a substrate terminal of the depletion transistor, a conductive state/nonconductive state of the depletion transistor being controlled by the control voltages.

As a result, the control terminal and the substrate terminal of the depletion transistor are substantially at the same potential, and even when the depletion transistor is formed as the device having a higher breakdown voltage, its effective cut-off voltage is reduced. Hence, the depletion transistor can be caused to enter the nonconductive state reliably when the output transistor is caused to enter the conductive state.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a circuit diagram illustrating a gate drive circuit 106 of FIG. 2.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described in detail with reference to the drawings.

Figure 1:
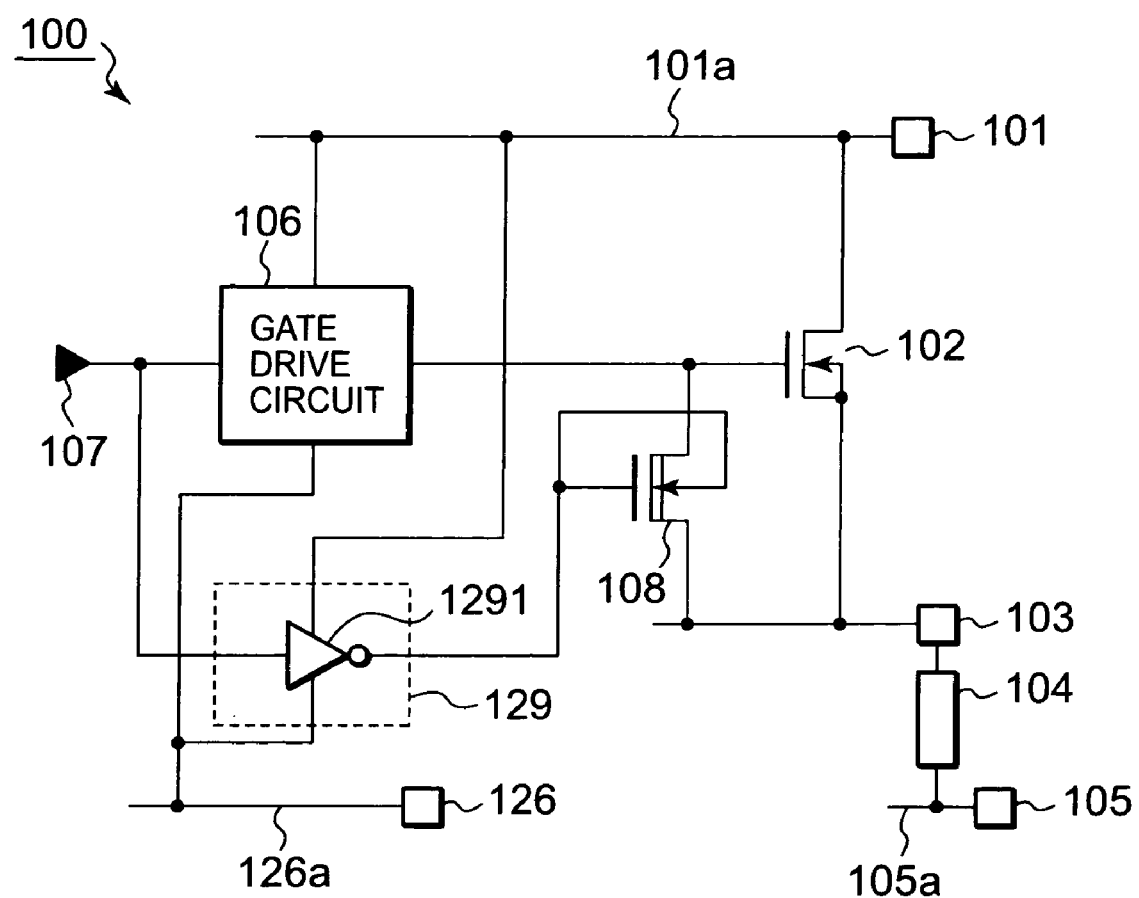
FIG. 1 is a circuit diagram of a semiconductor output circuit 100 according to a first embodiment of the present invention.

FIG. 1 illustrates a semiconductor output circuit 100 according to a first embodiment of the present invention, which is particularly a semiconductor output circuit excellent in application to automotive electrical components. A positive terminal of a battery is coupled to a first power supply terminal 101, and a negative terminal of the battery is coupled to a second power supply terminal 105, whereby a battery voltage as a power supply voltage is supplied. A first power supply line 101*a* and a second power supply line 105*a* are coupled to the first power supply terminal 101 and the second power supply terminal 105, respectively. A drain and a source of an n-channel enhancement output transistor 102 are coupled to the first power supply line 101*a* and an output terminal 103, respectively so that the n-channel enhancement output transistor 102 serves as a source follower. A load 104 is coupled between the output terminal 103 and the second power supply line 105*a*.

A control terminal (gate) of the output transistor 102 is supplied with a control (gate) potential by a gate drive circuit 106 based on a control signal 107 which controls a conductive state/nonconductive state. The control signal 107 is further supplied to a control circuit 129. In this case, an example in which the control circuit 129 is formed by a complementary metal-oxide semiconductor (CMOS) inverter 1291, but it also may be a circuit as disclosed in Tihanyi. The gate drive circuit 106 and the inverter 1291 are operated with a voltage supplied between the first power supply line 101*a* and a third power supply line 126*a*. The third power supply line 126*a* is coupled to the negative terminal of the battery through a third power supply terminal 126. Thus the third power supply line 126*a* is coupled to the second power supply line 105*a*. Incidentally, the second power supply terminal 105 and the third power supply terminal 126 are frequently connected to different nodes in an automotive electrical system apart from each other. Thereby voltage deference of about 2 V may occur between the second power supply line 105a and the third power supply line 126a.

An output from the inverter 1291 serving as the control circuit 129 is supplied to both a control terminal (gate or front gate) and a substrate terminal (back gate) of an n-channel depletion transistor 108. The depletion transistor 108 is coupled between the control terminal (gate) of the output transistor 102 and the output terminal 103. It should be noted that a substrate terminal (back gate) of the output transistor 102 is coupled to a source thereof.

Next, an operation of the semiconductor output circuit 100 will be described in detail. In the semiconductor output circuit 100, there are a conductive mode in which the output transistor 102 enters the conductive state to supply power to the load 104, and a nonconductive mode in which the output transistor 102 enters the nonconductive state. A description will be given in accordance with those two modes.

First, in the conductive mode, when the control signal 107 becomes a high level (potential of the first power supply line 101a), the gate drive circuit 106 increases a potential of an output node thereof to a potential obtained by boosting the potential of the first power supply line 101a so as to cause the output transistor 102 enter the conductive state at a lower channel resistance. On the other hand, in response to the control signal 107 at a high level, the inverter 1291 supplies the gate and the back gate of the depletion transistor 108 with a signal at a low level.

In this case, the depletion transistor 108 is in the conductive state even when the gate and the source thereof are at the same potential. Thus, a part of an output from the gate drive circuit 106 flows into the output terminal 103 through the depletion transistor 108. However, in this case, the depletion transistor 108 shows a constant current characteristic, and a driving ability of the gate drive circuit 106 is sufficiently larger, whereby the control (gate) potential of the output transistor 102 is increased to be brought into the conductive state. Accordingly, power supply to the load 104 is started.

As a control (gate) potential of the output transistor 102 increases, a potential of the output terminal 103 increases as well, and when the voltage applied between the gate and the source of the depletion transistor 108 is equal to or more than a cut-off voltage of the depletion transistor 108 (for example, the potential of the output terminal 103 is increased by about 2 V), the depletion transistor 108 enters the nonconductive state. On this occasion, the gate and the back gate of the depletion transistor 108 are commonly coupled to have the same potential, and thus an effective cut-off voltage thereof is reduced. In addition, even when the depletion transistor 108 is caused to have a higher breakdown voltage, a drain current (leak current) thereof can be suppressed to be smaller. Therefore, the depletion transistor 108 can be caused to enter the nonconductive state reliably.

As a result, the charge supplied from the gate drive circuit 106 is all accumulated in the control terminal (gate) of the output transistor 102, and hence the control (gate) potential of the output transistor 102 becomes sufficiently higher compared with the potential of the first power supply line 101a, and the output transistor 102 is brought into a triode region to have a smaller resistance. Accordingly, the potential of the output terminal 103 becomes substantially equal to the potential of the first power supply line 101a.

On the other hand, the control signal 107 is inverted to a low level in the nonconductive mode. In response to this, the gate drive circuit 106 starts discharging the gate charge of the output transistor 102.

Further, the control signal 107 at a low level is inverted by the inverter 1291, and the gate of the depletion transistor 108 is supplied with the potential of the first power supply line 101a at a high level. The depletion transistor 108 enters the conductive state even when the gate and the source thereof are at the same potential, and hence the gate charge of the output transistor 102 is further discharged to the output terminal 103 through the depletion transistor 108.

In this manner, the gate charge of the output transistor 102 is discharged through the gate drive circuit 106 and the depletion transistor 108, and the output transistor 102 is brought into the nonconductive state. In this way, the discharging of the gate charge from the output transistor 102 is completed, whereby the output transistor 102 enters the nonconductive state.

Even when the potential of the output terminal 103 varies depending on fluctuation of the second power supply line 105a, a short-circuited state is generated between the control terminal (gate) and the source of the output transistor 102 by the depletion transistor 108, with the result that the nonconductive state of the output transistor 102 can be maintained.

Figure 2:
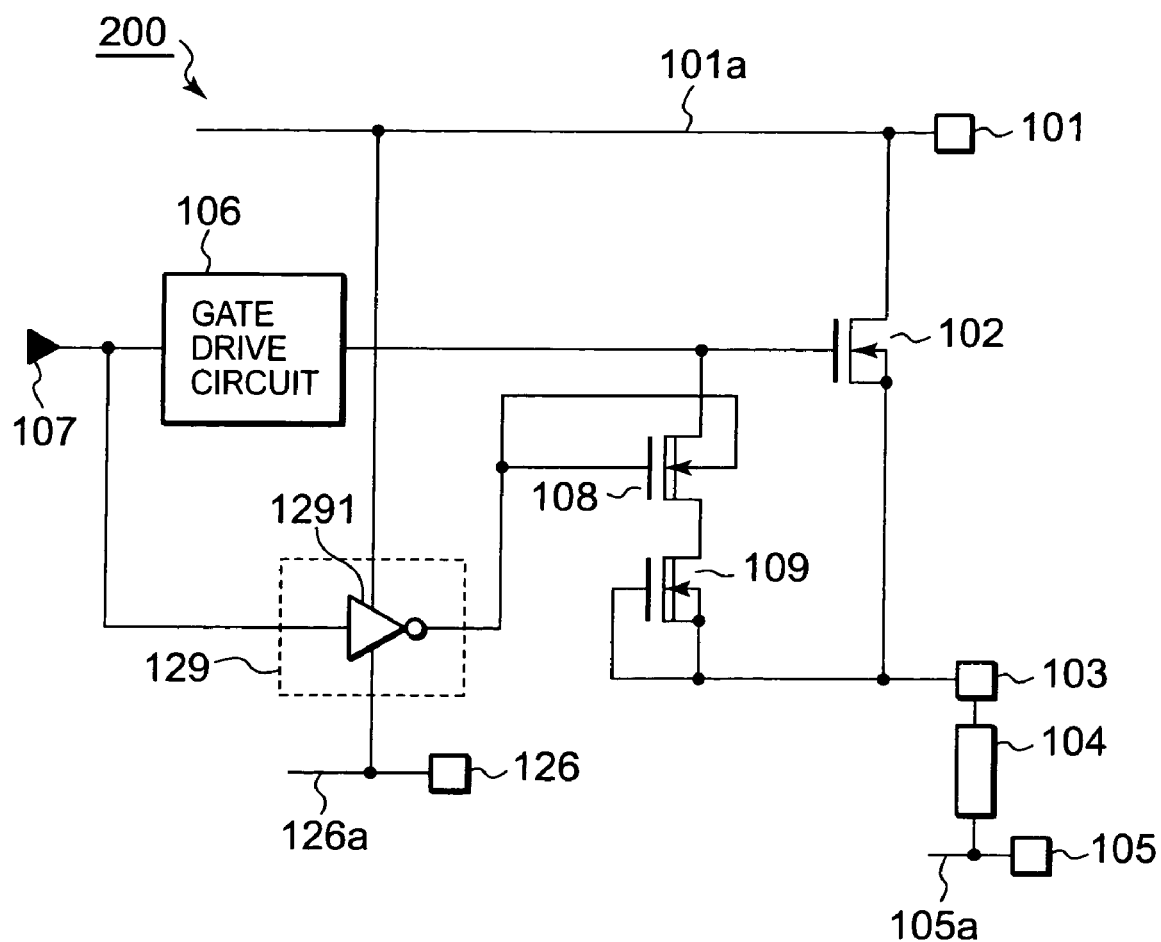
FIG. 2 is a circuit diagram of a semiconductor output circuit 200 according to a second embodiment of the present invention.

FIG. 2 illustrates a semiconductor output circuit 200 according to a second embodiment of the present invention, in which the same components as those of FIG. 1 are denoted by the same reference symbols, and their descriptions are omitted.

In the semiconductor output circuit 200, an n-channel depletion transistor 109 is coupled between the depletion transistor 108 and the output terminal 103. The depletion transistor 109 maybe coupled between the control terminal (gate) of the output transistor 102 and the depletion transistor 108. A control terminal (gate), a source, and a substrate terminal (back gate) of the depletion transistor 109 are commonly coupled, and the depletion transistor 109 is operated as a constant current source device. In other words, the constant current source device (depletion transistor 109) is coupled in series with the depletion transistor 108 between the control terminal (gate) of the output transistor 102 and the output terminal 103.

In application to automotive electrical components, the load 104 contains an inductance component or requires driving of a lamp or the like at larger current in some cases, and hence the output transistor 102 is desirably turned off relatively gradually for suppressing occurrence of noise.

Therefore, when the depletion transistor 109 as the constant current source device is provided, the gate charge of the output transistor 102 can be discharged at the constant current, with the result that noise generated upon turn-off of the output transistor 102 can be suppressed.

In order to reliably discharge the gate charge at the constant current, the gate charge of the output transistor 102 is desirably discharged predominantly by the depletion transistors 108 and 109. Therefore, it is desirable that an output of the gate drive circuit 106 be in a high impedance state in response to the low level of the control signal 107.

FIG. 3 illustrates the gate drive circuit 106 for realizing the above. The gate drive circuit 106 includes a charge pump circuit 140, an oscillation circuit 141, and inverters 156 to 159 which supply the charge pump circuit 140 with an oscillation signal sent from the oscillation circuit 141 at an appropriate phase.

The oscillation circuit 141 includes a NAND gate 151 and four inverters 152 to 155, and is coupled as illustrated in FIG.

3. The charge pump circuit 140 includes an inverter 160, a p-channel transistor 142, an n-channel transistor 143, three diodes 145 to 147, and three capacitors 148 to 150, and is coupled as illustrated in FIG. 3.

When the control signal 107 is at a high level, the oscillation circuit 141 starts an oscillation operation, and the charge pump circuit 140 is operated, whereby the control terminal (gate) of the output transistor 102 is supplied with a potential approximately three times the potential of the first power supply line 101a. In the case where the inverter 159, the capacitor 150, and the diode 147 are omitted, the control terminal (gate) of the output transistor 102 is supplied with a potential approximately twice the potential of the first power supply line 101a.

When the control signal 107 becomes a low level, the oscillation operation of the oscillation circuit 141 is stopped. Besides, the transistor 142 enters the nonconductive state, and accordingly, a cathode of the diode 147, namely, an output node of the gate drive circuit 106 enters the high impedance state.

In this manner, the gate charge of the output transistor 102 is discharged exclusively by the depletion transistors 108 and 109, and a discharging rate (voltage waveform) of the output transistor 102 can be determined by the constant current source device (depletion transistor 109).

As described above, the depletion transistor 108 provided between the control terminal (gate) of the output transistor 102 and the output terminal 103 can be caused to enter the nonconductive state reliably when the output transistor 102 is in the conductive state. In other words, because the gate and the back gate of the depletion transistor 108 are commonly coupled to have the same potential, the effective cut-off voltage is reduced, with the result that the drain current (leak current) can be suppressed to be smaller even when the depletion transistor 108 is caused to have a higher breakdown voltage. Moreover, when the output transistor 102 is in the nonconductive state, occurrence of an undesired stand-by current (DC current) can also be prevented. Further, a transition characteristic (discharging rate of the gate charge) of the output transistor 102 being shifted from the conductive state to the nonconductive state can also be controlled.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor output circuit, comprising:
   an output transistor coupled between a power supply line and an output terminal being configured to be coupled with a load;
   a depletion transistor coupled between a control terminal of the output transistor and the output terminal; and
   a control circuit supplying control voltages to both a control terminal and a substrate terminal of the depletion transistor, a conductive state/nonconductive state of the depletion transistor being controlled by the control voltages.

2. A semiconductor output circuit according to claim 1, further comprising:
   a constant current source device coupled in series with the depletion transistor between the control terminal of the output transistor and the output terminal.

3. A semiconductor output circuit according to claim 2, wherein the constant current source device comprises a depletion transistor.

4. A semiconductor output circuit according to claim 1, further comprising:
   a gate drive circuit,
   wherein the output transistor is driven by an output of the gate drive circuit, and the output of the gate drive circuit becomes a high impedance state when the output transistor is caused to enter the nonconductive state.

5. A semiconductor output circuit according to claim 4, wherein the gate drive circuit, in response to a control signal causing the output transistor to enter the conductive state, generates a higher potential than a potential of the power supply line to drive the output transistor with the higher potential.

* * * * *